United States Patent
Altekrüger et al.

(10) Patent No.: US 6,231,669 B1
(45) Date of Patent: May 15, 2001

(54) CRYSTAL PULLING UNIT

(75) Inventors: Burkhard Altekrüger; Joachim Aufreiter, both of Alzenau (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/273,495

(22) Filed: Mar. 22, 1999

(30) Foreign Application Priority Data

Mar. 26, 1998 (DE) .............................. 198 13 452

(51) Int. Cl.$^7$ .................................................. C30B 35/00
(52) U.S. Cl. .............................. 117/214; 117/18; 117/213
(58) Field of Search ................. 117/18, 213, 214, 117/912

(56) References Cited

U.S. PATENT DOCUMENTS

| | | | |
|---|---|---|---|
| 4,904,143 | 2/1990 | Drechsel et al. | 414/217 |
| 4,968,380 | 11/1990 | Freedman et al. | 156/608 |
| 5,229,082 | 7/1993 | Seidensticker et al. | 422/249 |
| 5,242,531 | 9/1993 | Klingshirn et al. | 156/620 |
| 5,324,488 | * 6/1994 | Klingshirn et al. | 117/213 |
| 5,419,462 | * 5/1995 | Johnston et al. | 222/183 |
| 5,580,171 | 12/1996 | Lim et al. | 366/336 |

FOREIGN PATENT DOCUMENTS

| | | |
|---|---|---|
| 4106589 | 9/1992 | (DE) . |
| 0314858 | 5/1989 | (EP) . |
| 0771891 | 5/1997 | (EP) . |
| 2240287 | 7/1991 | (GB) . |

OTHER PUBLICATIONS

Patent Abstracts of Japan, No. 07118089 (Komatsu Electron Metals Co. Ltd.), May 9, 1995.
Patent Abstracts of Japan, No. 09227271, (Shin Etsu Handotai Co. Ltd.), Sep. 2, 1997.
Patent Abstracts of Japan, No. 07265684, (Komatsu Electron Metals Co. Ltd.), Oct. 17, 1995.
Patent Abstracts of Japan, No. 07118089, May 9, 1995.
Patent Abstracts of Japan, No. 59008694, Jan. 17, 1984.
Patent Abstracts of Japan, No. 03008791, Jan. 16, 1991.

* cited by examiner

*Primary Examiner*—Felisa Hiteshew
(74) *Attorney, Agent, or Firm*—Smith, Gambrell & Russell, LLP

(57) ABSTRACT

A crystal pulling unit for the production of a crystal block has a recharging tube (7), via which granulate (17) is introduced into a crucible (2) with a melt (3), located inside a container (1). A fine-dust separator (8) is located in the recharging tube (7) outside the container (1); the separator works like an air classifier and, by means of a protective gas cushion, removes fine dusts from the granulate (17). This counters the danger of clogging of the recharging tube (7) by the caking of the recharging material.

11 Claims, 2 Drawing Sheets

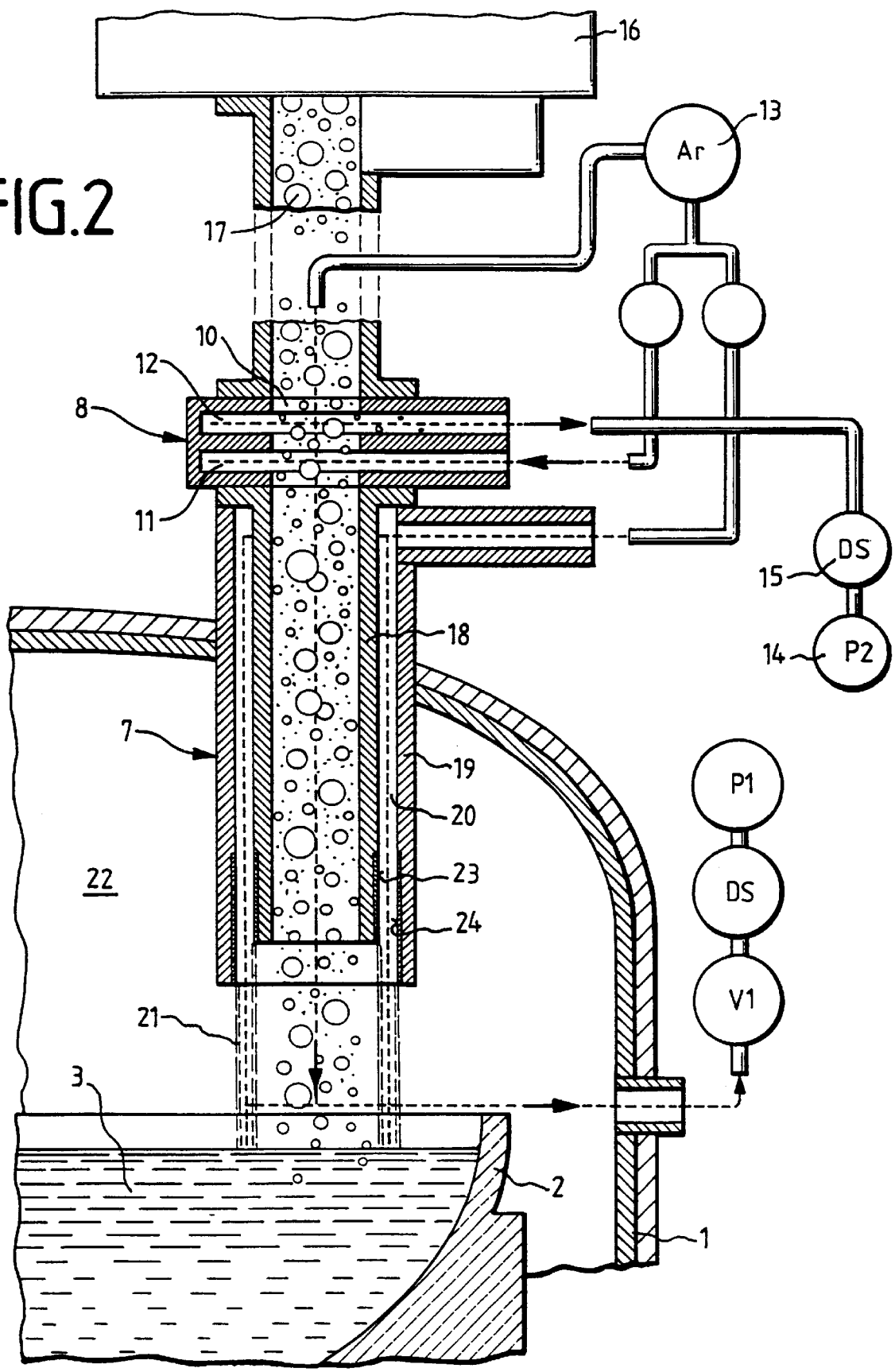

CRYSTAL PULLING UNIT

INTRODUCTION AND BACKGROUND

The present invention relates to a crystal pulling unit for the production of a crystal block, which has a crucible for the meltable material which forms the crystal block and which has a recharging tube leading to the crucible to supply the meltable material in granular form.

Crystal pulling units that are generally of the aforementioned type are known for the pulling of crystal blocks of semiconductor material according to the Czochralski method. These units operate mostly continuously, in that during the pulling of the crystal block, the meltable material which ultimately forms the melt is constantly supplied in the form of a granulate. Reference is made to German Patent No. 2,821,481 as an example of the state of the art. Comparable crystal pulling units, however, are also used for semi-continuous Czochralski pulling methods. The recharging tube is made of quartz material, as is the crucible.

In the operation of such crystal pulling units, it is often determined that the recharging tube becomes clogged. This requires a shutdown of the unit, which causes relatively high costs.

It is therefore an object of the invention to design a crystal pulling unit of the type discussed above in such a way that the danger of clogging in the recharging tube is as low as possible.

SUMMARY OF THE INVENTION

The above and other objects of the invention can be achieved by placing a fine-dust separator upstream from the recharging tube, and located outside the container or chamber containing the crucible.

This solution of the problem, in accordance with the invention, is based on the knowledge that the cause of the clogging in the recharging tube is to be found in the finer, dust-like particles in the recharging material. In the formation of a clogging condition, only these fine, dust-like particles of the supplied granulate stick, at first, by melting to the wall of the recharging tube. There, they form an adhesive film, on which later in the course of time, the coarser fractions of the granulate also stick and melt. This danger of the melting of fine fractions is particularly great with a heated recharging tube, as is described in German Patent No. 2,821,481, supra. The fine dust adhering to the granulate can be removed by the fine-dust separation, in accordance with the invention, before the granulate is introduced into the recharging tube, so that the actual cause of clogging is eliminated. At the same time, the danger of a development of dust in the pulling space is reduced by the fine-dust separator, in accordance with the invention.

BRIEF DESCRIPTION OF DRAWINGS

The invention permits various specific embodiments. For a further illustration of its basic principle, one of them is represented in the drawings and is described below. The drawings show the following in the figures:

FIG. 2 is a schematic representation of the area of a recharging tube of the crystal pulling unit of the invention.

DETAILED DESCRIPTION OF THE INVENTION

Figure 1:
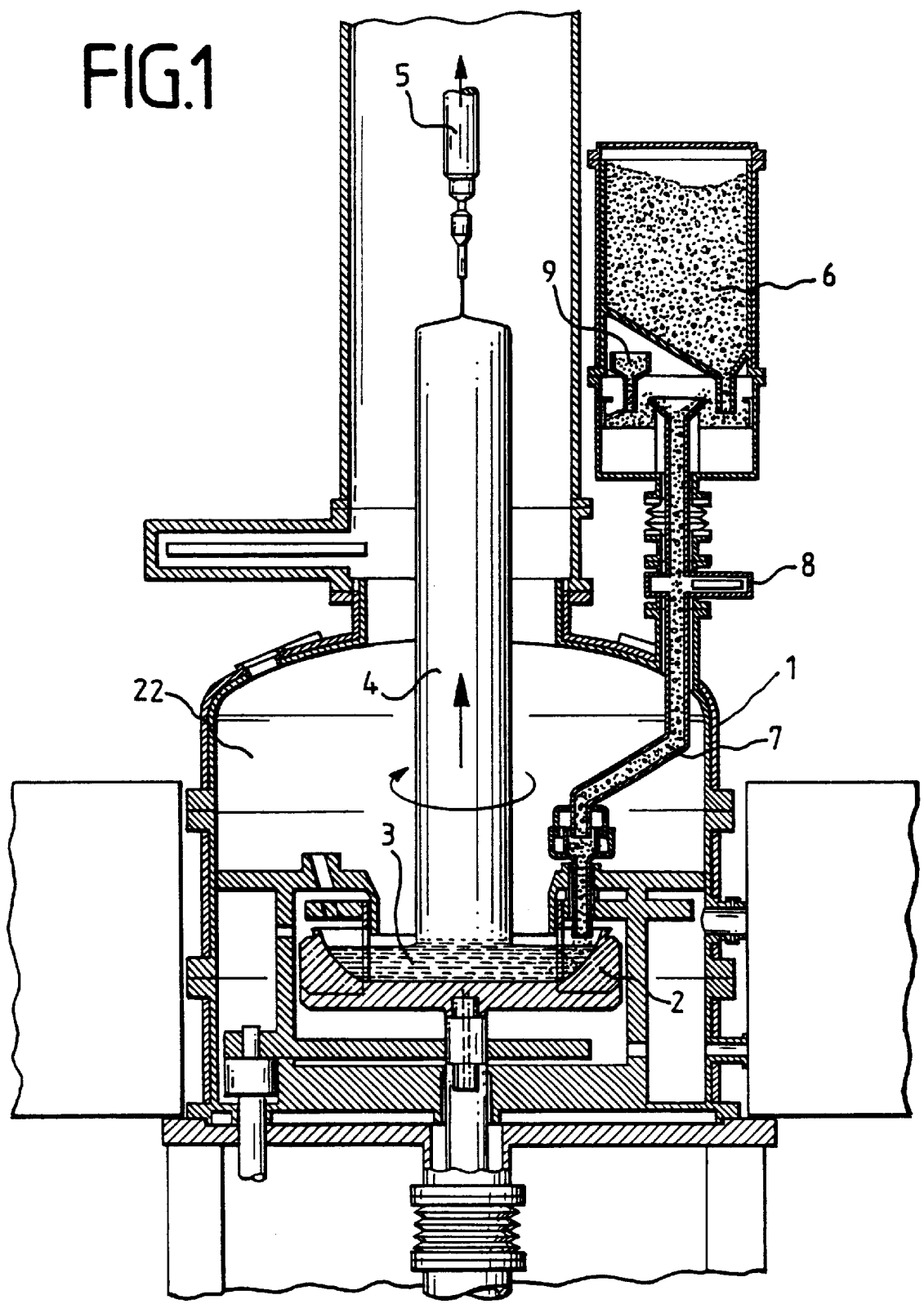
FIG. 1 is a vertical section through a crystal pulling unit according to the invention.

The fine dust separator is designed in a particularly simple manner in accordance with the present invention, if it is constructed as a pneumatic sifter operating with a protective gas which is inert with respect to the meltable material.

The fine-dust separator could be constructed as an air classifier, in which case a fluidized bed is formed over a longer distance. In this way, however, there is the danger that dust forms in the fine-dust separator when parts of the granulate rub against each other and when the granulate rubs against the walls of the air classifier. The danger of a formation of additional dust can be avoided, if in accordance with another refinement of the invention, the fine-dust separator has, above one another, an annular nozzle situated around an annular opening for the passage of the meltable material and, coaxially over it, a second annular nozzle for the suctioning off of the protective gas. Such a fine-dust separator has the additional advantage that it is constructed in a very compact manner and therefore takes up little space.

Usually, crystal pulling units for silicon blocks operate with argon as a protective gas, since argon can be obtained at a low price. Therefore, it is advantageous if for operation, the fine-dust separator also has a connection with a protective gas source for argon. Then, a small partial amount of argon can be shunted from the protective gas source to the container with the crucible.

The granulate supplied to the melt can be cooled when passing the fine-dust separator simultaneously by the supplied gas, if for operation, the fine-dust separator has a protective gas source for helium.

The recharging tube usually ends in the crystal pulling unit shortly above the liquid level of the melt. In this way, it is not possible to avoid that finer fractions still present in spite of the fine-dust separator in accordance with the invention, or dust just formed in the recharging space by the friction of the granulate on the wall of the recharging tube or by the rubbing of parts of the granulate with one another are not immersed in the melt or melt rapidly after striking the level of the liquid, but rather dance up and down on the surface of the melt and thereby are introduced into the pulling space above the level of the liquid and can be deposited on unit parts and the crystal block.

Such a danger of the passage of finer fractions of the recharging material into the pulling space can be countered effectively in that the recharging tube has an annular space between an inside wall and an outside wall. This annular space is open on the lower end of the recharging tube and is connected with a protective gas source for the supply of the protective gas. A gas haze or mist, which prevents the recharging material from entering the pulling space, is formed around the outlet of the recharging tube by means of such an annular space with a gas throughflow. At the same time, the annular space and the gas flowing in it keep the temperature of the inside wall surface of the recharging tube lower than with previously known recharging tubes. As a result, the danger of baking of the recharging material is reduced.

Since crystal pulling units usually work with argon as a protective gas, the expense for the formation of the gas mist at the exit of the recharging tube is particularly low, if the annular space is connected with a protective gas source for argon.

The recharging tube can be cooled particularly effectively if the annular space is connected with a protective gas source for helium.

For the additional reduction of the temperature of the inside wall of the recharging tube, it is helpful if the inside wall of the recharging tube is ground to a matte finish toward the side of the annular space, at least in the lower area on the outside.

FIG. 1 shows a closed container 1, in which a crucible 2 made of quartz material is located. A melt 3 of silicon, from which a crystal block 4 is pulled in a pulling space 22 by means of a pulling device 5, is located in this crucible 2. To this end, the crystal block 4 rotates around its longitudinal axis and is pulled uniformly upwards at the rate of the crystal growth.

Outside the container 1, granulate storage unit 6, from which silicon granulate is supplied to the melt 3 via a recharging tube 7, is located. A fine dust separator 8, which is located outside the container 1 between it and the granulate storage unit 6, is important for the invention. Doping material from a doping material storage unit 9 can also be supplied to the melt 3 via the recharging tube 7.

The schematic sketch according to FIG. 2 illustrates the design of the fine-dust separator 8 and the recharging tube 7. The fine-dust separator 8 has an annular opening 10, which is enclosed by two annular nozzles 11, 12, located directly above one another. The annular nozzle 11 is connected with an argon protective gas source 13, so that argon is able to flow via the nozzle into the annular opening 10 which is suctioned off directly above the annular nozzle 11 via the annular nozzle 12. For this purpose, the unit has a pump 14 with a dust filter 15 upstream. A conveyor 16 is schematically indicated in FIG. 2, on which the recharging material, formed as a granulate 17, is supplied to the fine-dust separator 8 and from which it falls into the annular opening 10. Within the annular opening 10, this granulate 17 is freed from the dust adhering to it by the gas cushion formed by the argon, so that granulate 17, which is largely free of dust, is introduced into the recharging tube 7, through which it falls into the melt 3.

The recharging tube 7 is constructed with double walls. It has an annular space 20, which is open at the lower front side of the recharging tube 7 and which is used to supply protective gas from the protective gas source 13, between an inside wall 18 and an outside wall 19. Since the annular space 18 of the recharging tube 7 is open at the lower front side of the recharging tube 7, a gas mist 21 flows out there from the recharging tube 7 and prevents dust particles falling through the recharging tube 7 from migrating laterally, and in that way can be introduced into the pulling space 22.

FIG. 2 indicates that the conveyor path upstream fine-dust separator 8 for the production of a flushing gas flow on its upper side, which is limited by the inside wall 18, can also be connected with the protective gas source 13. Furthermore, one can see in FIG. 2 that the inside wall 18 and the outside wall 19 of the recharging tube 7 can be provided with a matte finish 23, 24, toward the side of the annular space 20, at least in the lower area, outside, in order to decrease the heat irradiation.

Further variations and modifications of the foregoing will be apparent to those skilled in the art and are intended to be encompassed by the claims appended hereto.

German priority application 198 13 452.5 is relied on and is incorporated herein by reference.

We claim:

1. A crystal pulling unit for production of a crystal block, comprising: a crucible for holding a meltable material that forms a crystal block; a recharging tube leading to the crucible for supplying the meltable material in granulate form to said crucible; a container for holding the crucible; and a fine-dust separator located outside the container and upstream from the recharging tube with respect to a direction of movement of the meltable material, wherein the fine-dust separator connects to the recharging tube and removes dust from the granulated meltable material before the granulated meltable material is introduced into the container.

2. The crystal pulling unit according to claim 1, wherein the fine-dust separator is an air classifier operating with a protective gas, wherein the protective gas is inert with respect to the meltable material.

3. The crystal pulling unit according to claim 2, wherein the fine-dust separator has a first annular nozzle, located around an annular opening for passage of the meltable material, to supply the protective gas, and coaxially above it, a second annular nozzle, to suction off the protective gas.

4. The crystal pulling unit according to claim 1, wherein the fine-dust separator has a first annular nozzle, located around an annular opening for passage of the meltable material, to supply a protective gas, and coaxially above it, a second annular nozzle, to suction off the protective gas.

5. The crystal pulling unit according to claim 1, wherein said fine-dust separator is connected with a protective gas source for argon.

6. The crystal pulling unit according to claim 1, wherein said fine-dust separator is connected with a protective gas source for helium.

7. The crystal pulling unit according to claim 1, wherein said recharging tube has an inside wall and an outside wall, wherein an annular space is defined between the inside wall and the outside wall, said annular space being open at a lower front side of the recharging tube and connected with a protective gas source for supplying protective gas in the annular space.

8. The crystal pulling unit according to claim 7, wherein the protective gas source supplies argon.

9. The crystal pulling unit according to claim 7, wherein the protective gas source supplies helium.

10. The crystal pulling unit according to claim 7, wherein at least one of the inside wall and the outside wall of the recharging tube is provided with a matte finish facing the annular space, at least in the lower front side of the recharging tube.

11. The crystal pulling unit according to claim 1, further comprising a conveyor path located upstream of the fine-dust separator with respect to the direction of movement of the meltable material, wherein the conveyor path is connected with a protective gas source to produce a purge-gas flow upstream of the fine-dust separator.

* * * * *